(12) United States Patent  (10) Patent No.: US 7,530,000 B2
Fairhurst et al.  (45) Date of Patent: May 5, 2009

(54) EARLY DETECTION OF STORAGE DEVICE DEGRADATION

(75) Inventors: Matthew J. Fairhurst, Winchester (GB); Thomas W. Rickard, Ampfield (GB)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 11/669,150

(22) Filed: Jan. 30, 2007

(65) Prior Publication Data

US 2007/0234148 A1 Oct. 4, 2007

(30) Foreign Application Priority Data

Jan. 31, 2006 (GB) .................................... 0601829

(51) Int. Cl.
*G06F 11/00* (2006.01)
(52) U.S. Cl. ........................................ 714/742; 714/41
(58) Field of Classification Search ..................... 714/6, 714/8, 54, 13, 742, 41; 711/114
See application file for complete search history.

(56) References Cited

U.S. PATENT DOCUMENTS

| 7,100,076 | B2* | 8/2006 | Johnson et al. | 714/13 |
| 7,168,001 | B2* | 1/2007 | Johnson et al. | 714/13 |
| 7,376,862 | B2* | 5/2008 | Hajji et al. | 714/6 |
| 2002/0091965 | A1* | 7/2002 | Moshayedi | 714/8 |
| 2008/0215811 | A1* | 9/2008 | Hajji et al. | 711/114 |

* cited by examiner

*Primary Examiner*—David Ton
(74) *Attorney, Agent, or Firm*—Jeffrey P. Aiello

(57) ABSTRACT

An apparatus operable with a host and a data storage component for detecting a storage device susceptible to failure under I/O workload is provided. The apparatus includes a selector component for selecting a pair of storage devices in the data storage component. A data migration control component is provided for initiating migration of data from a first to a second storage device of the pair of storage devices. An I/O workload mirroring component is provided for mirroring an I/O workload from a first of the pair of storage devices to a second of the pair of storage devices. A storage device failure detecting component for detecting failure of one of the pair of storage devices is also included. The selector component further comprises a timer component for periodically initiating the selecting.

20 Claims, 2 Drawing Sheets

EARLY DETECTION OF STORAGE DEVICE DEGRADATION

BACKGROUND OF THE INVENTION

1. Field of the Invention

The present invention relates to technology for controlling data storage systems, and more particularly to early detection of storage device degradation.

2. Background Information

Data storage subsystems having plural devices, such as Redundant Array of Inexpensive Disk (RAID) arrays, store customer data on multiple storage devices to avoid data loss if one or more data storage device fails. The present invention relates to such plural-device storage subsystems, which may comprise disk storage, such as RAID arrays. It is clear that other storage devices, including, but not limited to, tape and flash memory devices, may also be included in such a subsystem.

To minimize the time the system operates without redundancy, some storage devices may be configured as "hot spare" devices. Under normal operating circumstances, these hot spares do not hold customer data. As soon as an array member fails in operation, however, the subsystem chooses a hot spare to replace the failed array member and then rebuilds the array using the hot spare. While the array is in the process of rebuilding it operates with reduced redundancy, which means there is a pressure to rebuild as quickly as possible.

A further possible use of a storage device, apart from as a member, a spare, or a failed device, is as an array candidate or free device. These are devices that are ready to be used either by being configured as array members in the creation of a raid array or by being configured as hot spares. In the meantime, they remain idle, and any degradation they might have suffered remains invisible to the subsystem control components.

In spite of the built-in redundancy and the use of hot spares, there remains the problem that a storage device can fail when it is idle and in that case the subsystem does not detect the failure until it attempts substantial I/O to the device. This is usually at an inconvenient time to detect the failure, i.e. just when the device is needed to accept data I/O activity.

Hot spare devices sit idle while waiting for array members to fail. Their condition can degrade during this time such that they fail when the subsystem attempts to do substantial I/O to them during the array rebuild. This is disadvantageous because the subsystem must operate longer with reduced redundancy (and, in the worst case, if there are no more spares, manual intervention by way of physically replacing a device may be required), thus increasing the chance of data loss. As has been pointed out above, the same problem exists for free devices: their condition may degrade while they stand idle and the system does not detect this until they are turned into array members and subjected to an I/O workload.

Indeed, this same problem may exist for devices that are configured as active array members in some cases. Lightly loaded or periodically idle arrays are not unusual. When an array member fails a rebuild begins. The rebuild operation is typically designed to run as quickly as possible, which puts stress on all the other array members, typically including some active array members that have not been used for I/O for some time. Another disk failure at this point causes an array loss for singly-redundant RAID systems (e.g. RAID 5), and in other subsystems at least slows down the process by requiring repeated I/Os.

Disk drives implement self-test procedures of varying degrees of complexity. In some enterprise class disk drives, this includes a background media scan which checks that blocks remain readable. These features may improve matters, but they do not attempt to simulate a "real-life" customer workload. This solution is also disk drive vendor and model specific, and, in particular lower cost (e.g. SATA) disk drives are less likely to implement these features.

RAID controllers implement array and disk scrubbing. These processes check that all blocks of array members, hot spares and free disks are readable every few days. Again these features do not attempt to simulate a customer workload. The process is also potentially disruptive to normal processing because of the amount of I/O time and device resource that is diverted to attend to them.

Various advanced RAID techniques exist that use distributed sparing. In this scheme there are no dedicated hot spare devices, but instead spare capacity is distributed around each array. This eliminates the hot spare problem completely. However, it is very hard to retrofit such a scheme to an existing RAID architecture with dedicated hot spare devices.

In the light of the disadvantages with the above-mentioned techniques, it would be highly to have a technological means for the early detection of disk degradation, without the cost and inconvenience incurred by complex and cumbersome measures.

SUMMARY OF THE INVENTION

The invention provides an apparatus operable with a host and a data storage component for detecting a storage device susceptible to failure under I/O workload. The apparatus includes a selector component for selecting a pair of storage devices in the data storage component. A data migration control component is provided for initiating a migration of data from a first of the pair of storage devices to a second of the pair of storage devices. An I/O workload mirroring component is also provided for mirroring an I/O workload from a first of the pair of storage devices to a second of the pair of storage devices. The apparatus also includes a storage device failure detecting component for detecting failure of one of the pair of storage devices.

The selector component may further comprise a timer component for periodically initiating the selecting. In an embodiment of the apparatus, the first of the pair of storage devices is an active member and the second of the pair of storage devices is a hot spare. In an embodiment of the apparatus, the first of the pair of storage devices is an active member and the second of the pair of storage devices is a free device.

In an embodiment of the apparatus, the data migration control component allows the migration to complete and the active member and the hot spare exchange roles. In an embodiment of the apparatus, the data migration control component allows the migration to complete and the active member and the free device exchange roles. In an embodiment of the apparatus the data storage component comprises a RAID array.

The invention also provides a method for use with a host and a data storage component for detecting a storage device susceptible to failure under I/O workload. The method comprises selecting, by a selector component, a pair of storage devices in the data storage component. A data migration control component then initiates a migration of data from a first of the pair of storage devices to a second of the pair of storage devices. An I/O workload mirroring component mirrors an I/O workload from a first of the pair of storage devices to a second of the pair of storage devices. A storage device failure detecting component detects failure of one of the pair of storage devices.

The method may further include the step of selecting further comprising periodically initiating the selecting responsive to action by a timer component. In the method, the first of the pair of storage devices is an active member and the second of the pair of storage devices is a hot spare. Also, the first of the pair of storage devices is an active member and the second of the pair of storage devices is a free device.

In the method, the data migration control component may allow the migration to complete and the active member and the hot spare to exchange roles. In the method, the data migration control component may allow the migration to complete and the active member and the free device to exchange roles.

The method of the invention may be provided on a data carrier having functional data thereon. The functional data comprising functional computer data structures to, when loaded into a computer system and operated upon thereby, enable the computer system to perform all the steps of the method. The method of the invention may be provided via a computer program comprising computer program code. When loaded into a computer system and executed, the computer system would be able to perform all the steps of the method.

Embodiments of the invention thus contemplate, in their broadest aspect, a technical framework for the early detection of disk degradation.

DESCRIPTION OF THE PREFERRED EMBODIMENTS

Figure 1:
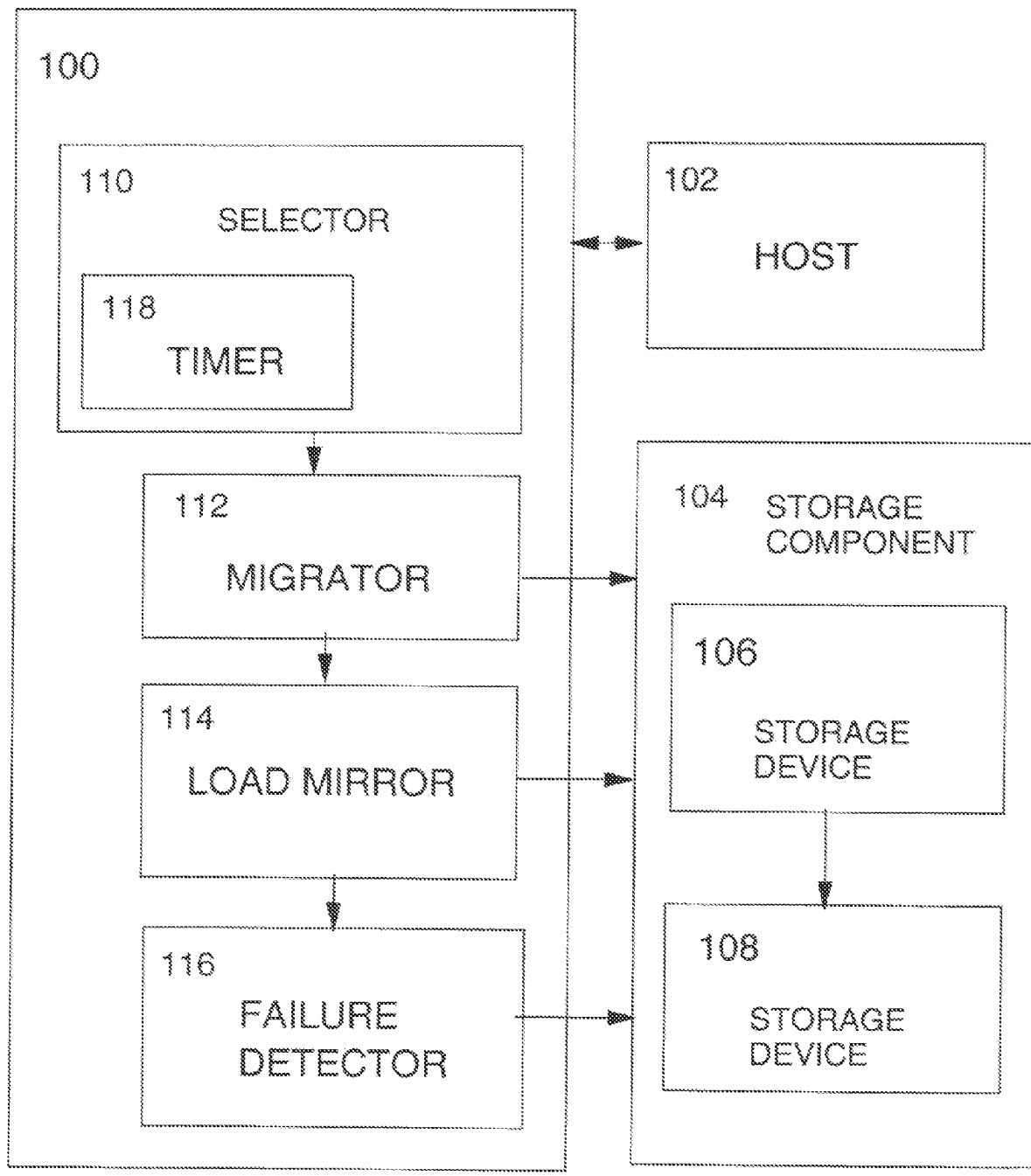
FIG. 1 shows in schematic form an arrangement of apparatus in accordance with an embodiment of the invention.

An embodiment of the invention is to use a disk migration technique to periodically change which drives in a subsystem are configured as hot spares or free disks, and thus exercise (apply a workload to) disks that would not be exercised when the system is in normal use.

The invention ensures that disks are exposed to genuine customer workloads. This may allow early detection of more failures and increase subsystem reliability. The invention does not require special support from the disk drives. This enables storage subsystems to use cheaper drives or drives from other vendors without compromising reliability in this area. In an idle array, the invention actively provokes workloads similar to that which is typically being applied when an array member fails.

In an embodiment of the invention, disk exercising is performed by means of a full or partial concurrent disk drive migration. Concurrent disk migration, as provided by, for example, the spare migration function of the IBM® TotalStorage® DS8000 Series products. (IBM and TotalStorage are trademarks or registered trademarks of IBM Corporation, Armonk, N.Y.), is a technique which allows one disk drive in an array (the source drive) to be replaced by another (the destination drive) without reducing the redundancy of the array. The process works by copying data from source to destination, mirroring writes while the copy is in progress. When the copy is complete the source device is replaced by the destination device and there is no further relationship between the two devices.

In another embodiment, software on a storage controller runs at time interval T and identifies P pairs of disk drives. It is clear that this function could also be implemented in specialized hardware, such as a dedicated processor, or in logic incorporated in firmware. Each pair consists of one disk drive currently configured as a hot spare or free drive, and one configured as an array member. The disk drives identified may be those that have been configured with their current roles (member, spare, or free) for longest. The software starts a migration between each pair of disk drives to reverse their roles.

The choices of the variables T and P affect the amount of subsystem resources used by the migrations and the amount of I/O seen by the disk drives. These may be tuned according to the demands of a particular application.

One possible implementation may allow the migration to run to completion. In this case, the hot spare role rotates slowly through the population. This effectively addresses potential problems with hot spare or free drives failing while idle, but does not generate much workload to active array members. There are typically many more active array members than hot spares, a ratio of 50:1 is not uncommon.

One alternative embodiment is for the software to stop the migration part way through, so that the disk drives maintain their original roles and both disks have had some exercise. Several of these partial migrations can be done for the same bandwidth cost of migrating an entire hot spare, thus exercising several array members. This approach places somewhat more pressure on the hot spares because they are always used as migration targets, and so a combination of partial and complete migrations may be preferable.

Turning to FIG. 1, which shows in schematic form an arrangement of an apparatus in accordance with one embodiment of the present invention, there is shown an apparatus 100 operable with a host 102 and a data storage component 104 for detecting a storage device 106, 108 susceptible to failure under I/O workload. The apparatus comprises a selector component 110 for selecting a pair of storage devices 106, 108 in the data storage component 104. A data migration control component 112 is operable to initiate a migration of data from the first storage device 106 to the second storage device 108. An I/O workload mirroring component 114 is operable to mirror an I/O workload from the first storage device 106 to the second storage device 108. A storage device failure detecting component 116 is operable to detect any failure of either one or both of the pair of storage devices 106, 108.

The selector component 110 may further comprise a timer component 118 for periodically initiating the selecting of the pair of storage devices 106, 108. Apparatus 100 may communicate with external devices (not shown) to signal any detected failure, and may signal that an operator intervention is required, or may signal to cause initiation of an automatic failover to a working replacement disk.

It will be clear from the foregoing description that the first of the pair of storage devices 106 may be an active member and the second of the pair of storage devices 108 may be a hot spare. In an alternative embodiment, the first of the pair of storage devices 106 may an active member and the second of the pair of storage devices 108 may be a free device. The data migration control component 112 may allow the migration to complete so that active member 106 and the hot spare or free device 108 may exchange roles.

The apparatus 100 advantageously addresses the problem of early detection of disk degradation, without the additional cost and inconvenience incurred by the more complex and cumbersome measures. The apparatus 100 may be implemented in a processor device, including, but not limited to, a processor in a computer host system or a storage controller device.

Figure 2:
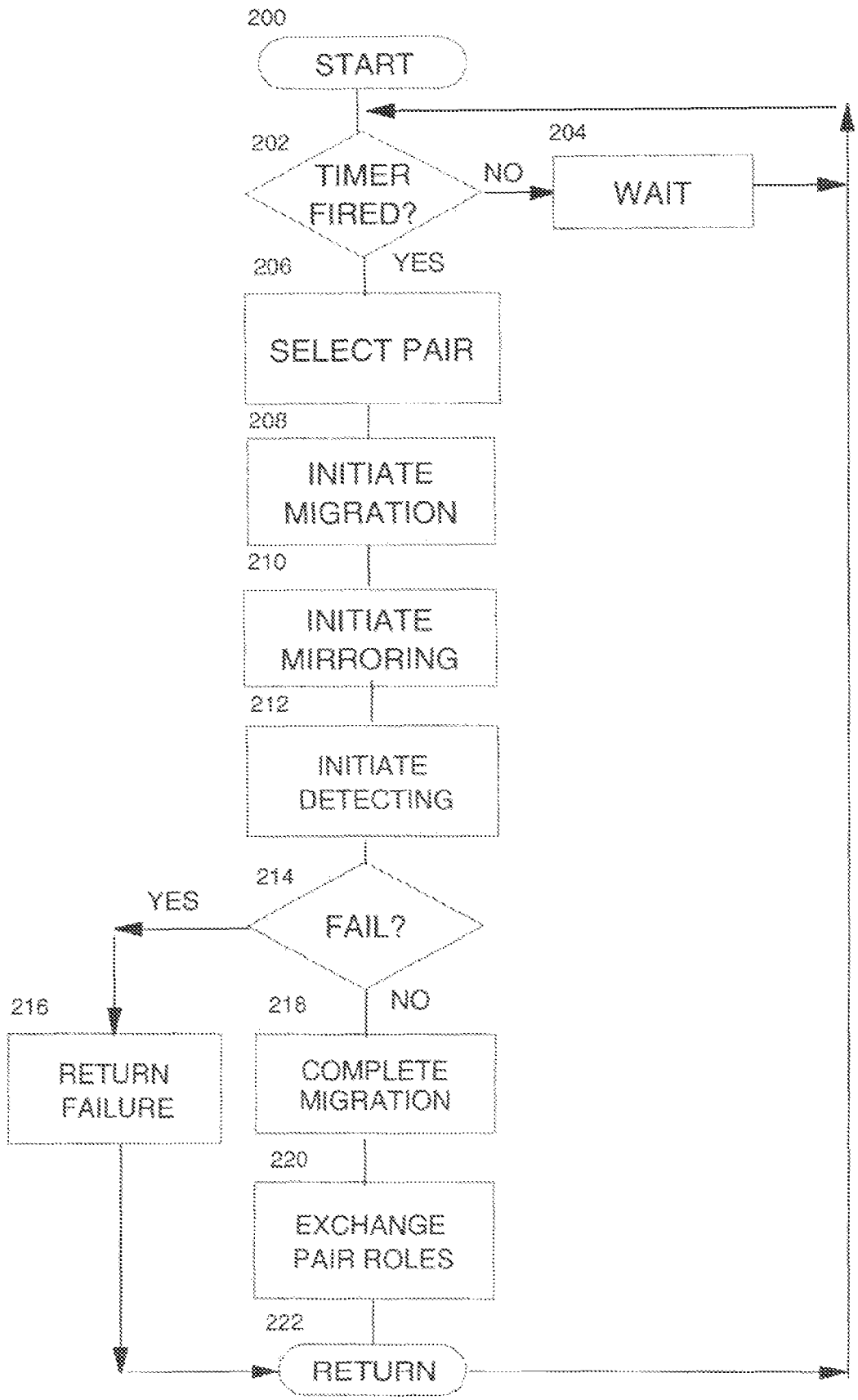
FIG. 2 shows in flowchart form one method or one logic arrangement in which a method of operation according to an embodiment of the invention may be implemented.

Turning to FIG. 2, there is shown in flowchart form, one method, or one logic arrangement, in which a method of operation according to an embodiment of the invention may be implemented. The invented method is for use with a host and a data storage component for detecting a storage device susceptible to failure under I/O workload. The method begins at step 200, where the START of the process by which the detection is enabled. The method may comprise an optional step 202 of detecting expiry of a timer for initiating a selection 206 responsive to expiry of the predetermined time period, and may wait at step 204 for the expiry of the time period. At step 206, a selector component selects a pair of storage devices in the data storage component. At step 208, a data migration control component initiates a migration of data from the first of the pair of storage devices to the second of the pair of storage devices. At step 210, an I/O workload mirroring component initiates mirroring of an I/O workload from the first of the pair of storage devices to the second of the pair of storage devices, and at step 212, storage device failure detection is initiated to detect any failure of one or both of the pair of storage devices.

If a failure is detected at step 214, a failure signal is returned at step 216, and the process executes a return at step 222. If no failure is detected, the migration may continue to completion at step 218. At step 220, migration having completed at step 218, the selected pair may change roles. That is, the active member (see FIG. 1, 106) may become a hot spare or free device and the hot spare or free device (see FIG. 1, 108) may become an active member in its place.

In one alternative embodiment, the migration may be only partial, and steps 218 and 220 may be omitted, the pair members (see FIG. 1, 106, 108 retaining their original roles). In either case, the process next executes a return at step 222.

The method, or logic arrangement, advantageously addresses the problem of early detection of disk degradation, without the additional cost and inconvenience incurred by the more complex and cumbersome measures.

It will be clear to one of ordinary skill in the art that all or part of the method of the preferred embodiments of the present invention may suitably and usefully be embodied in a logic apparatus, or a plurality of logic apparatus, comprising logic elements arranged to perform the steps of the method and that such logic elements may comprise hardware components, firmware components or a combination thereof.

It is to be understood that all or part of a logic arrangement according to the embodiments of the invention may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

It will be appreciated that the method and arrangement described above may also suitably be carried out fully or partially in software running on one or more processors (not shown in the figures), and that the software may be provided in the form of one or more computer program elements carried on any suitable data-carrier (also not shown in the figures) such as a magnetic or optical disk or the like. Channels for the transmission of data may likewise comprise storage media of all descriptions as well as signal-carrying media, such as wired or wireless signal-carrying media.

The invention may further suitably be embodied as a computer program product for use with a computer system. Such an implementation may comprise a series of computer-readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

In an alternative embodiment, the invention may be realized in the form of computer implemented method of deploying a service comprising steps of deploying computer program code operable to, when deployed into a computer infrastructure and executed thereon, cause the computer system to perform the steps of the method.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An apparatus operable with a host and a data storage component for detecting a storage device susceptible to failure under I/O workload, the apparatus comprising:
   a selector component for selecting a pair of storage devices in the data storage component;
   a data migration control component for initiating a migration of data from a first of the pair of storage devices to a second of the pair of storage devices;
   an I/O workload mirroring component for mirroring an I/O workload from a first of the pair of storage devices to a second of the pair of storage devices; and
   a storage device failure detecting component for detecting failure of one of the pair of storage devices.

2. The apparatus of claim 1 wherein the selector component further comprises a timer component for periodically initiating the selecting.

3. The apparatus of claim 1 wherein the first of the pair of storage devices is an active member and the second of the pair of storage devices is a hot spare.

4. The apparatus of claim 3 wherein the data migration control component allows the migration to complete and wherein the active member and the hot spare exchange roles.

5. The apparatus of claim 1 wherein the first of the pair of storage devices is an active member and the second of the pair of storage devices is a free device.

6. The apparatus of claim 5 wherein the data migration control component allows the migration to complete and wherein the active member and the free device exchange roles.

7. The apparatus of claim 1 wherein the data storage component comprises disk storage.

8. The apparatus of claim 7 wherein the data storage component comprises a RAID array.

9. The apparatus of claim 1 wherein the selector component selects as the second of the pair of storage devices a storage device that has a longest idle time.

10. A method for use with a host and a data storage component for detecting a storage device susceptible to failure under I/O workload, comprising the steps of:
    selecting a pair of storage devices in the data storage component;
    initiating a migration of data from a first of the pair of storage devices to a second of the pair of storage devices;
    mirroring an I/O workload from a first of the pair of storage devices to a second of the pair of storage devices; and
    detecting failure of one of the pair of storage devices.

11. The method of claim 10 wherein the step of selecting further comprises periodically initiating the selecting responsive to action by a timer component.

12. The method of claim 10 wherein the first of the pair of storage devices is an active member and the second of the pair of storage devices is a hot spare.

13. The method of claim 12 wherein a data migration control component allows the migration to complete and wherein the active member and the hot spare exchange roles.

14. The method of claim 10 wherein the first of the pair of storage devices is an active member and the second of the pair of storage devices is a free device.

15. The method of claim 14 wherein a data migration control component allows the migration to complete and wherein the active member and the free device exchange roles.

16. The method of claim 10 wherein the data storage component comprises disk storage.

17. The method of claim 16 wherein the data storage component comprises a RAID array.

18. The method of claim 10 wherein the step of selecting comprises selecting as the second of the pair of storage devices a storage device that has a longest idle time.

19. A computer program comprising computer program code to, when loaded into a computer system and executed thereon, cause the computer system to perform the method of claim 10.

20. An apparatus for detecting a storage device susceptible to failure under I/O workload comprising:
    a selector for selecting a pair of storage devices in a data storage component;
    a data migration control for initiating a migration of data from a first of the pair of storage devices to a second of the pair of storage devices;
    an I/O workload mirroring component for mirroring an I/O workload from a first of the pair of storage devices to a second of the pair of storage devices; and
    a storage device failure detector for detecting failure of one of the pair of storage devices.

* * * * *